(12) United States Patent
Machul

(10) Patent No.: US 6,664,781 B2
(45) Date of Patent: Dec. 16, 2003

(54) INDUCTIVE PROXIMITY SENSOR WITH A DIFFERENTIALLY COUPLED ENERGY SOURCE

(75) Inventor: Olaf Machul, Freiburg (DE)

(73) Assignee: Sick AG, Waldkirch/Breisgau (DE)

( * ) Notice: Subject to any disclaimer, the term of this patent is extended or adjusted under 35 U.S.C. 154(b) by 0 days.

(21) Appl. No.: 10/206,476

(22) Filed: Jul. 25, 2002

(65) Prior Publication Data

US 2003/0048186 A1 Mar. 13, 2003

(30) Foreign Application Priority Data

Jul. 30, 2001 (DE) .......................................... 101 37 091

(51) Int. Cl.$^7$ ............................. G01B 7/14; G01B 7/00
(52) U.S. Cl. ............................. 324/207.12; 331/117 R; 324/207.16; 324/207.26
(58) Field of Search ...................... 324/207.26, 207.16, 324/207.17, 207.12, 207.25, 207.24, 240, 329, 336; 331/74, 61, 62, 63, 64, 65, 73, 117 R, 167

(56) References Cited

U.S. PATENT DOCUMENTS

| | | | | |
|---|---|---|---|---|
| 4,893,076 | A | * | 1/1990 | Leonard et al. ............. 324/236 |
| 5,079,502 | A | * | 1/1992 | Rogachi et al. .......... 324/207.19 |
| 6,215,365 | B1 | | 4/2001 | Kurkovxkiy |
| 6,335,619 | B1 | * | 1/2002 | Schwab et al. ......... 324/207.26 |

FOREIGN PATENT DOCUMENTS

| | | |
|---|---|---|
| DE | 3320509 A1 | 12/1984 |
| DE | 3704893 C2 | 8/1988 |
| DE | 4232426 A1 | 4/1993 |
| DE | 3320509 C2 | 2/1994 |
| DE | 19614528 A1 | 10/1997 |
| DE | 19650793 C1 | 4/1998 |
| DE | 19654329 A1 | 6/1998 |
| DE | 19907135 A1 | 9/2000 |
| DE | 19926799 A1 | 12/2000 |
| WO | WO 00/35092 A1 | 6/2000 |

OTHER PUBLICATIONS

Web Page, RODONI, "Oscillator," http://N.ethz.ch/student/rodonil/da/report/node28.html, Jan. 26, 2001, 2 pages, XP002217815 downloaded from the internet on (Oct. 22, 2002).

Baschirotto, et al., "Low–voltage Balanced Transconductor with High Input Common Mode Rejection," *Electronic Letters*, vol. 30, No. 20, XP000047491, pp. 1669–1671, (Sep. 29, 1994).

Web Page, "LC Oscillator Has 1% THD," *Maxim Application Notes*, http://www.maxim-ic.com/appnotes.cfm/appnote,_Number/116, Jul. 9, 1998, 2 pages, XP002217816 downloaded from the internet on (Oct. 22, 2002).

\* cited by examiner

*Primary Examiner*—N. Le
*Assistant Examiner*—Subhash Zaveri
(74) *Attorney, Agent, or Firm*—Townsend and Townsend and Crew, LLP

(57) ABSTRACT

An inductive proximity switch includes an electrical resonant circuit and an energy source coupled therewith to compensate for losses in the resonant circuit. The energy source is fully differentially coupled with the resonant circuit at the input side.

13 Claims, 2 Drawing Sheets

INDUCTIVE PROXIMITY SENSOR WITH A DIFFERENTIALLY COUPLED ENERGY SOURCE

BACKGROUND OF THE INVENTION

The invention relates to an inductive proximity sensor comprising an electrical resonant circuit and an energy source coupled therewith to compensate for losses in the resonant circuit.

Inductive proximity sensors are used in automation engineering to define operating states in automating plants, production systems (e.g. welding robots) and process engineering plants. Proximity switches effect the detection of the presence or absence of electrically conductive workpieces or machine parts. Applications such as revolution measurements or speed measurements on rotating parts or parts moved in a translatory manner are likewise conceivable.

Inductive proximity sensors have a lossy resonant circuit (oscillator) at the input side whose loss resistance can be changed, for example, by the proximity of an electrically conductive medium. If such a response element is brought into sufficient proximity to the resonant circuit, a corresponding attenuation or attenuation equalization of the resonant circuit can be caused and detected in order, for example, to trigger a switch signal.

The resonant circuit constantly loses energy, which has to be compensated to prevent an unwanted decaying of the oscillation, due to magnetization losses in the ferrite, to the DC resistance of the coil or to the loss through the attenuation by the response element.

For this purpose, an energy source 40 is provided by which a compensation current $I_{comp}$ in accordance with FIG. 2 can be fed into the resonant circuit to compensate for the previously mentioned losses.

The energy source 40 is realized, for example, from a voltage-to-current converter 44 comprising a downstream or integrated current limiter 46 in accordance with FIG. 3. The amplitude of the resonant circuit 42 can be set directly by the current limiter 46. If the energy source 40 in accordance with FIG. 2 is subjected to positive feedback, then it behaves like a negative, current limited resistance $R_{neg}$ since the voltage $U_{OSC}$ dropping over the resonant circuit and the compensation current $I_{comp}$ fed back are directed in opposing directions to one another in accordance with the reference arrow conventions. The negative resistance $R_{neg}$ is responsible for the compensation of the losses in the resonant circuit.

Such LC resonant circuits 42 are frequently operated in the saturated working range so that component tolerances have only an insignificant influence on the response behavior of the resonant circuit 42. This is shown in the region III of FIG. 4 in which the maximum value GW of the compensation current $I_{comp}$ is entered over the voltage loss $U_{osc}$ at the resonant circuit. The resonant circuit 42 is excited in this region III by rectangular current pulses. The same current is always coupled into the resonant circuit 42 irrespective of the resonant circuit amplitude due to the working range selected.

The resulting resonant circuit amplitude $U_{OSC}=(4/\pi) \times I_{sat} \times R_p$ is only dependent on the saturation current $I_{sat}$ and the loss resistance $R_p$ of the resonant circuit with a symmetrical output current ($\pm I_{sat}$) of the energy source 40.

The disadvantage of this working range, however, is a lower sensitivity on the attenuation of the resonant circuit. Electrically or magnetically coupled interference, which can occur when the proximity sensor is used in the industrial environment, superimposes an interference signal on the small wanted signal and this results in an influencing of the resonant circuit or in an accidental switch signal.

These interference signals can have both a push-pull character and a push-push character. The influencing of the resonant circuit can ultimately trigger an unwanted switch signal without an electrically conductive target being disposed in the switch distance of the proximity sensor.

SUMMARY OF THE INVENTION

It is therefore an object of the invention to provide an inductive proximity sensor with a reduced proneness to interference signals and an improved response behavior.

This object is satisfied for a proximity sensor of the kind first explained in that the energy source is fully differentially coupled with the resonant circuit at the input side.

In this connection, "fully differentially" means that the two inputs of the energy source have no relation to the circuit ground (most negative potential of the circuit) or to any other constant potential. Only the push-push portion of the two inputs is controlled to signal ground (typically half the operating voltage) to ensure the largest possible excitation range. Unlike conventional energy sources for known proximity sensors, none of the inputs of the energy source coupled with the LC resonant circuit is on signal ground or circuit ground.

Those connections of the energy source are to be considered the inputs of the energy source via which the voltage dropping at the resonant circuit is picked up for the definition of the amplitude of the resonant circuit.

The proximity sensor has the advantage of a doubled signal stroke due to the coupling in accordance with the invention of the LC resonant circuit and the energy source. The initially mentioned disadvantage of a lower sensitivity due to the selected working range (see FIG. 4, region III) is thereby compensated with the advantage still being maintained of a lower sensitivity of the response behavior of the resonant circuit with respect to present component tolerances.

The coupling in accordance with the invention of the resonant circuit and the energy source furthermore effects improved interference sensitivity by a higher signal-to-noise performance ratio.

The proximity sensor in accordance with the invention furthermore enables larger ranges with respect to known proximity sensors due to the doubled signal stroke.

Ultimately, the proximity sensor in accordance with the invention only processes push-pull portions of the resonant circuit voltage and suppresses push-push portions. Push-push portions in the resonant circuit voltage can be caused, on the one hand, by inductive uncouplings in the LC resonant circuit, caused for example by welding apparatuses located in the vicinity or by capacitive couplings into the connection lines between the resonant circuit and the energy source. In the conventional proximity sensor, this push-push interference results in an influencing of the resonant circuit and ultimately in a false switching.

It is preferred for the outputs of the energy source to be coupled with the inputs to make the compensation current available.

It must furthermore be noted with respect to the invention that any kind of energy source can be used to compensate for the energy losses inside the resonant circuit. In particular, the energy source can have a voltage-to-current converter, for example an operational transconductivity amplifier.

In a preferred embodiment of the invention, the compensation energy, in particular the electrical compensation current, which can be fed into the resonant circuit from the energy source, is limited by a limit switch. The amplitude of the resonant circuit can be correspondingly limited in this manner. This limitation of the compensation current or of the amplitude of the oscillation can preferably be adjusted.

It is furthermore preferred if the energy source is produced in the CMOS design.

The invention will be explained in the following by way of example with reference to the drawings.

DESCRIPTION OF THE PREFERRED EMBODIMENTS

Figure 1:
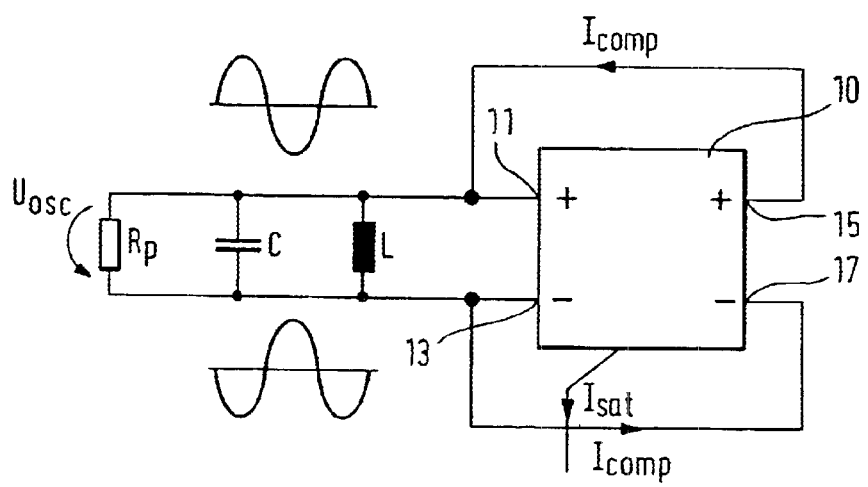
FIG. 1 is a block diagram of a resonant circuit and of an energy source coupled therewith.
Figure 2:
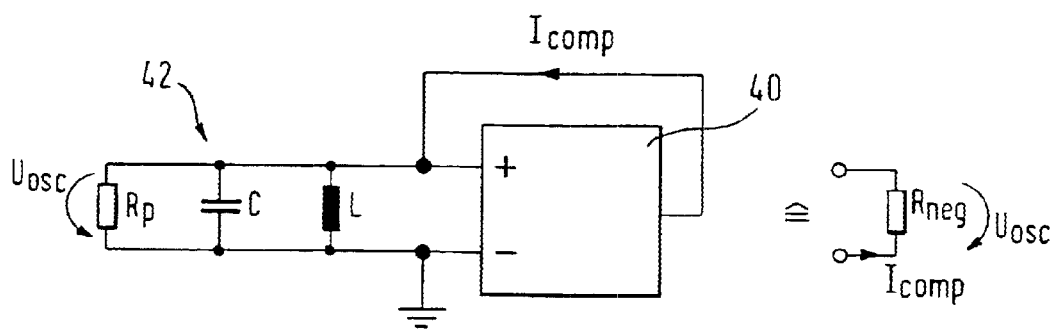
FIG. 2 is a block diagram of a resonant circuit and of an energy source coupled therewith in accordance with the prior art.
Figure 3:
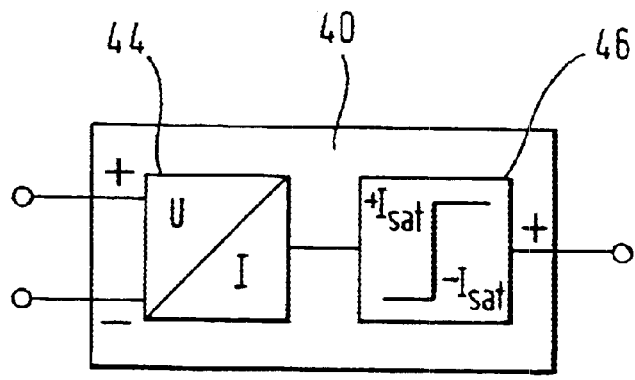
FIG. 3 shows an embodiment of the energy source of the prior art.
Figure 4:
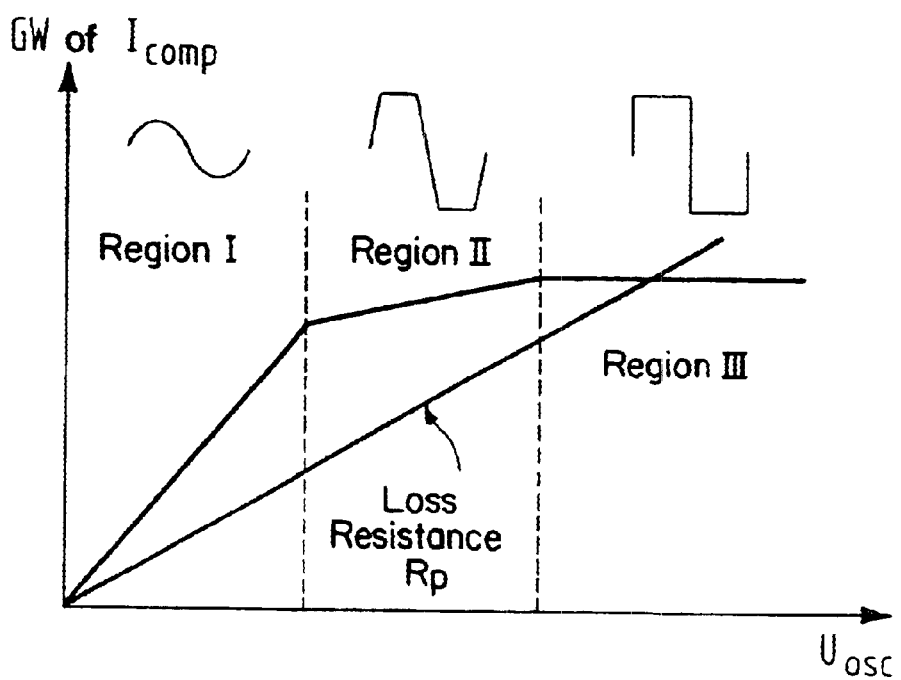
FIG. 4 is a representation of the working ranges of a resonant circuit.

FIG. 1 shows a resonant circuit formed by a capacitor C and a coil L having a loss resistance $R_p$. The voltage $U_{OSC}$ drops over this resonant circuit.

An energy source 10, which can be made as an operational transconductivity amplifier (OTA), is coupled with the resonant circuit. This coupling is made fully differentially, i.e. a positive input 11 and a negative input 13 of the energy source 10 are connected to the resonant circuit without the potential of one of these two connections being fixed to a constant value. The energy source 10 detects push-pull signals of the resonant circuit via these two inputs 11, 13, whereas interference signals, which are expressed due to the fully differential coupling as push-push signals, are suppressed.

To compensate the attenuation losses within the circuit, compensation currents $I_{comp}$ are supplied to the resonant circuit via outputs 15, 17 of the energy source 10, and indeed in dependence on the push-pull signal (resonance oscillation) applied to the inputs 11, 13.

As indicated in FIG. 1 for the saturation current $I_{sat}$ of the energy source 10, the limitation of the compensation currents $I_{comp}$ is adjustable in order to thereby limit the maximum amplitude of the oscillation within the resonant circuit.

The circuit in accordance with FIG. 1 forms part of an inductive proximity sensor which furthermore has an evaluation circuit (not shown) coupled with the resonant circuit.

A proximation of the response element is detected in a known manner by this in order, for example, to trigger a switching signal—when the sensor is made as a proximity switch.

What is claimed is:

1. An inductive proximity sensor comprising:

a resonant circuit; and an energy source coupled to the resonant circuit and configured to compensate for losses in the resonant circuit, wherein the coupling between the energy source and the resonant circuit is fully differential.

2. The proximity sensor in accordance with claim 1, wherein the energy source has a differential pair of input terminals, and neither of the input terminals is coupled to a fixed potential.

3. The proximity sensor in accordance with claim 1, wherein the energy source includes a voltage-to-current converter.

4. The proximity sensor in accordance with claim 3, wherein the voltage-to-current converter comprises a transconductivity amplifier.

5. The proximity sensor in accordance with claim 1, wherein the energy source includes a current limiter.

6. The proximity sensor in accordance with claim 5, wherein the current limiter is adjustable.

7. The proximity sensor in accordance with claim 1, wherein the energy source is made in a CMOS design.

8. An inductive proximity sensor comprising:

a resonant circuit;

an energy source coupled with the resonant circuit and configured to compensate for the losses in the resonant circuit, wherein the coupling between the energy source and the resonant circuit is fully differential; and an evaluation circuit coupled to the resonant circuit and configured to detect push-pull signals.

9. The proximity sensor in accordance with claim 8, wherein the energy source has a differential pair of input terminals, and neither of the input terminals is coupled to a fixed potential.

10. The proximity sensor in accordance with claim 8, wherein the energy source includes a voltage-to-current converter.

11. The proximity sensor in accordance with claim 10, wherein the voltage-to-current converter comprises a transconductivity amplifier.

12. The proximity sensor in accordance with claim 8, wherein the energy source includes a current limiter.

13. The proximity sensor in accordance with claim 12, wherein the current limiter is adjustable.

* * * * *